United States Patent [19]

Ota

[11] Patent Number: 5,211,758
[45] Date of Patent: May 18, 1993

[54] CHEMICAL VAPOR DEPOSITION APPARATUS

[75] Inventor: Yoichiro Ota, Itami, Japan

[73] Assignee: Mitsubishi Denki Kabushiki Kaisha, Tokyo, Japan

[21] Appl. No.: 775,040

[22] Filed: Oct. 11, 1991

[30] Foreign Application Priority Data

Apr. 17, 1991 [JP] Japan .................................. 3-84954

[51] Int. Cl.$^5$ ............................................ C23C 16/00
[52] U.S. Cl. .................................. 118/722; 118/715; 118/725; 118/726; 423/219
[58] Field of Search ............... 118/715, 725, 726, 722; 423/219

[56] References Cited

U.S. PATENT DOCUMENTS

| | | | |
|---|---|---|---|
| 4,564,509 | 1/1986 | Shealy et al. | 423/210.5 |
| 4,659,552 | 4/1987 | Tom | 423/219 |
| 4,734,273 | 3/1988 | Haskell | 423/219 |
| 4,735,634 | 4/1988 | Norman | 423/219 |

FOREIGN PATENT DOCUMENTS

EP361386  4/1990  European Pat. Off.

OTHER PUBLICATIONS

Shealy et al., Improved Photoluminescence of Organometallic Vapor Phase Epitaxial AlGaAs Using a New Gettering Technique on the Arsine Source, Appl. Phys. Lett 42(1), 83–85 (1983).

Shealy et al., A New Technique for Gettering Oxygen and Moisture from Gases Used In Semiconductor Processing, Appl. Phys. Lett 41(1), 88–90 (1992).

*Primary Examiner*—Richard Bueker
*Attorney, Agent, or Firm*—Leydig, Voit & Mayer

[57] ABSTRACT

A chemical vapor deposition apparatus having a gas purifier for purifying a raw-material gas such as $AsH_3$ or $PH_3$ gas, the gas purifier being constructed as the combination of an organometal and a molecular sieve. Gas of $AsH_3$, $PH_3$ or the like is introduced into the organometal whereby impurities such as $H_2O$ or $O_2$ contained in the raw-material gas ($AsH_3$, $PH_3$, etc) are removed. Further, organometal vapor occured from gas purifier is removed by the molecular sieve.

4 Claims, 1 Drawing Sheet

CHEMICAL VAPOR DEPOSITION APPARATUS

BACKGROUND OF THE INVENTION

1. Field of the Invention

The present invention relates to a chemical vapor deposition apparatus and, more specifically, to a chemical vapor deposition apparatus having a purifier for purifying a gas such as $AsH_3$ or $PH_3$ gas used in chemical vapor deposition.

2. Description of the Related Art

FIG. 2 schematically shows a conventional metal organic chemical vapor deposition (MOCVD) apparatus, such as that shown, for example, in "Appl. Phys. Lett., 42(1), pages 83 to 85 (1983)" or "Appl. Phys. Lett., 41(1), pages 88 to 90 (1982)". As shown in FIG. 2, a $H_2$ gas cylinder 1 is connected by a pipe 2a to an organometal cylinder device 3 connected with a reactor 4 so that organometal vapor from the organometal cylinder device 3 is conveyed by $H_2$ gas and introduced into the reactor 4. $H_2$ gas is introduced from the $H_2$ gas cylinder 1 through another pipe 2b into the reactor 4. An $AsH_3$ or $PH_3$ gas cylinder 5, serving as a raw-material gas supplying means, is connected by a pipe 2c to a gas purifier 6 so that $AsH_3$ or $PH_3$ gas from the cylinder 5 is introduced to the purifier 6, and purified thereby. The purified raw-material gas is introduced through a pipe 2d into the reactor 4. After a reacting process, the gases, such as unreacted gases, remaining in the reactor 4 is exhausted to the outside of the apparatus by an exhausting means 7.

With the conventional chemical vapor deposition apparatus having the above-described construction, the organometal vapor conveyed by $H_2$ gas into the reactor 4 is mixed with $AsH_3$ or $PH_3$ gas and heated, whereby these substances decompose and react with each other so that the resultant product precipitates to form a crystal. When, for instance, an AlGaAs-based crystal is to be grown, trimethyl aluminum (TMA) and trimethyl galium (TMG) are reacted with $AsH_3$. When an InP-based crystal is to be grown, trimethyl indium (TMI) is reacted with $PH_3$.

In order to increase the purity of the crystal which is to be obtained, $AsH_3$ or $PH_3$ gas from the raw-material supplying means is introduced to the gas purifier 6. After substances such as $H_2O$ and $O_2$ are removed from the $AsH_3$ or $PH_3$ gas, the raw-material gas is introduced into the reactor 4. The gas purifier 6 has a vessel containing a suitable low-melting-point metal, such as AlGaIn, which is in its liquid state at normal temperature. The raw-material gas ($AsH_3$ or $PH_3$) is bubbled into the low-melting-point metal (AlGaIn).

Such a conventional chemical vapor deposition apparatus entails the following problem: vapor of Al, Ga, In, or compounds thereof may be introduced into the reactor 4 from the low-melting-point metal AlGaIn used in the gas purifier 6. If vapor of Al or the like are introduced into the reactor 4 during the growth of an AlGaAs- or InP-based crystal, the crystal structure may be adversely influenced, or the introduced vapor may cool and solidify in the pipe 2d, thereby clogging the pipe.

SUMMARY OF THE INVENTION

The present invention has been accomplished to overcome the above-described problem. An object of the present invention is to provide a chemical vapor deposition apparatus capable of removing impurities such as $H_2O$ and $O_2$ from a raw-material gas such as $AsH_3$ or $PH_3$ gas, and also capable of preventing substance such as vapor of Al, Ga, In or compounds thereof from being introduced into the reactor, the apparatus thus being capable of growing high-quality crystals.

In order to achieve the above object, according to the present invention, there is provided a chemical vapor deposition apparatus comprising: means for supplying raw-material gas; means for purifying the raw-material gas supplied from the raw-material gas supplying means, the raw-material gas purifying means having an organometal through which the raw-material gas is passed, and a molecular sieve through which the raw-material gas passed through the organometal is sieved; a reactor in which the raw-material gas purified by the purifying means undergoes reaction so that a crystal of the product of the reaction is grown; and exhausting means for exhausting the gases remaining in the reactor after a reaction process.

DESCRIPTION OF THE PREFERRED EMBODIMENT

Figure 1:
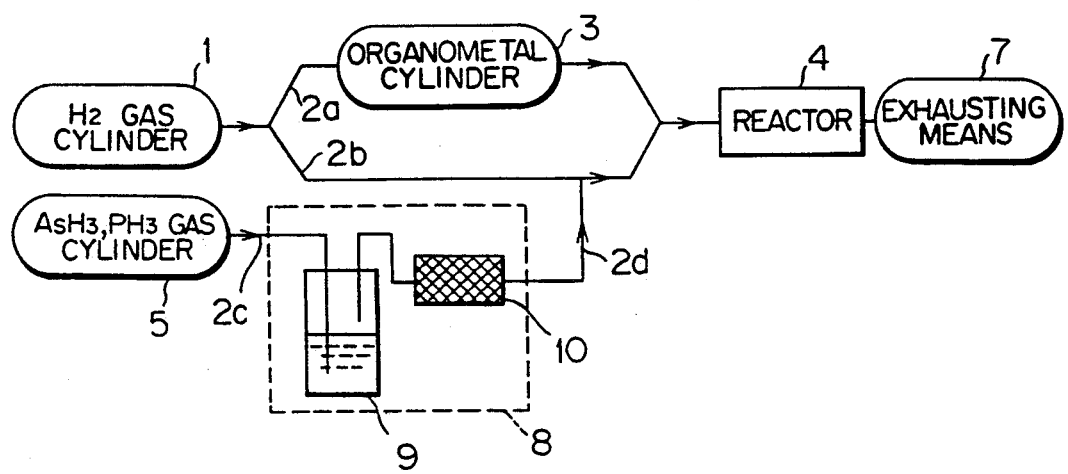
FIG. 1 is a diagram schematically showing a chemical vapor deposition apparatus according to an embodiment of the present invention.
Figure 2:
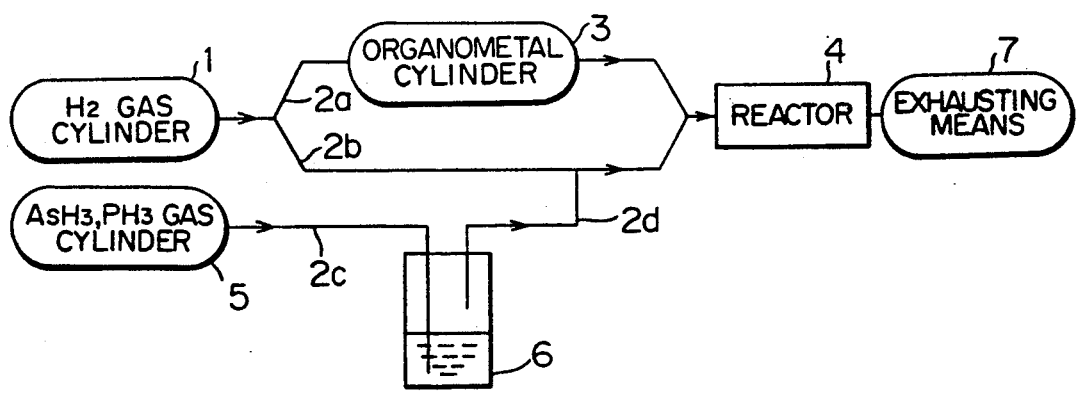
FIG. 2 is a diagram schematically showing a conventional chemical vapor deposition apparatus.

FIG. 1 schematically shows a chemical vapor deposition apparatus, such as a MOCVD apparatus, according to an embodiment of the present invention. In FIG. 1, the components which are the same as or correspond to those shown in FIG. 2 are denoted by identical reference numerals, and the description of these components will be omitted.

Referring to FIG. 1, the apparatus includes a gas purifier 8 as the means for purifying a raw-material gas such as $AsH_3$ or $PH_3$ (hereinafter referred to as "$AsH_3$ or $PH_3$ gas"). The gas purifier 8 comprises a purification organometal cylinder 9 receiving a purification organometal, and a molecular sieve 10. The purification organometal received in the cylinder 9 may be either the same organometal, such as TMA, TMG or TMI, that is contained in the organometal cylinder 3, or a different organometal. A molecular sieve made of zeolite or porous glass is a preferable example of the molecular sieve 10.

In the chemical vapor deposition apparatus having the above-described construction, organometal vapor is conveyed from the organometal cylinder device 3 into the reactor 4 by $H_2$ gas from a $H_2$ gas cylinder 1, and $AsH_3$ or $PH_3$ gas is conveyed from the $AsH_3$ or $PH_3$ gas cylinder 5 into the reactor 4 through the pipe 2d. In the reactor 4, the organometal vapor is mixed with the $AsH_3$ or $PH_3$ gas and heated, whereby these substances decompose and react with each other so that the resultant product precipitates to form an AlGaAs- or InP-based crystal. After a reaction process, the exhausting means 7 exhausts the gases remaining in the reactor 4 to the outside of the apparatus.

In order to improve the purity of the crystal which is to be obtained, the $AsH_3$ or $PH_3$ gas is introduced to the gas purifier 8. In the gas purifier 8, the $AsH_3$ or $PH_3$ gas is first bubbled into the liquid-state organometal, such as TMA or TMG, received in the purification organometal cylinder 9 so that impurities, such as $H_2O$ and $O_2$, contained in the $AsH_3$ or $PH_3$ gas are removed. An organometal is very active with respect to $H_2O$, $O_2$ and the like. For instance, TMA reacts with $H_2O$ in the following manner:

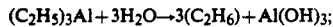

Also, TMA reacts with $O_2$ in the following manner:

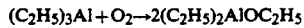

When $Al(OH)_3$ is thus generated, since this substance is non-volatile, it is removed in a vapor bubbling process. When $(C_2H_5)_2AlOC_2H_5$, a volatile substance, is generated, it is removed by the molecular sieve 10 together with TMA vapor. It is believed that $AsH_3$ molecules and $PH_3$ molecules both have a radius of about 1.5 Å, while TMA molecules have a radius of about 4 Å, and $(C_2H_5)_2AlOC_2H_5$ molecules have a radius of not less than 4 Å (these values being calculated on the basis of the ion radius and the covalent radius according to L. Pauling). On the other hand, the size of the pores of a molecular sieve made of zeolite or porous glass approximately ranges from several Å to several $\mu$m. Therefore, when an appropriate molecular sieve is used, although gases such as $AsH_3$, $PH_3$ and $H_2$ are passed through the molecular sieve, substances such as TMA and $(C_2H_5)_2AlOC_2H_5$ are not passed through it. Accordingly, it possible to prevent impurities from being introduced into the reactor 4.

Thus, the present invention is characterized in that the gas purifier is constructed as the combination of a purification organometal and a molecular sieve. The gas purifier allows an organometal, such as TMA, and impurities to be transformed into volatile substances having a relatively great molecule radius, and allows these substances to be removed by the molecular sieve. The organometal itself can also be removed. Thus, the arrangement of the present invention must be distinguished from an arrangement in which a molecular sieve is simply mounted on a conventional gas purifier 6 because, in this case, such substances as Al, Ga and In cannot be removed, and the $AsH_3$ or $PH_3$ gas cannot be purified.

Although, in the foregoing embodiment, a liquid-state organometal is used as the purification organometal, similar effects will be provided if the purification organometal is substituted with a solid-state organometal such as TMI. In this case, a solid-state organometal is received in a cylinder 9, and the interior of the cylinder 9 is saturated with $AsH_3$ or $PH_3$ gas in order to purify the raw-material gas. Further, similar effects may be achieved by using a solid-state organometal in a raw-material organometal cylinder 3.

As described above, the present invention provides the effect of preventing unwanted introduction of impurities into the reaction means, thereby enabling a high-quality crystal to be obtained.

What is claimed is:

1. A chemical vapor deposition apparatus comprising:
   means for supplying raw-material gas;
   means for purifying the raw-material gas supplied from the raw-material gas supplying means, the raw-material gas purifying means having an organometal through which the raw-material gas is passed, and a molecular sieve through which the raw-material gas passed through said organometal is sieved;
   a reactor in which the raw-material gas purified by the purifying means undergoes reaction so that a crystal of the product of said reaction is grown; and
   exhausting means for exhausting the gases remaining in said reactor after a reaction process.

2. A chemical vapor deposition apparatus according to claim 1 wherein said organometal is selected from the group consisting of trimethyl aluminum, trimethyl galium and trimethyl indium.

3. A chemical vapor deposition apparatus according to claim 1 wherein said molecular sieve is made of porous glass.

4. A chemical vapor deposition apparatus according to claim 1 wherein said molecular sieve is made of zeolite.

* * * * *